United States Patent
Tsunoda et al.

(10) Patent No.: US 9,449,125 B2
(45) Date of Patent: Sep. 20, 2016

(54) COMPUTER-IMPLEMENTED METHOD FOR SIMULATING FLOW OF FLUID AROUND SOLID OBJECT

(71) Applicant: SUMITOMO RUBBER INDUSTRIES, LTD., Kobe-shi, Hyogo (JP)

(72) Inventors: Masaya Tsunoda, Kobe (JP); Arjun Yadav, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 413 days.

(21) Appl. No.: 14/054,415

(22) Filed: Oct. 15, 2013

(65) Prior Publication Data

US 2014/0142908 A1    May 22, 2014

(30) Foreign Application Priority Data

Nov. 16, 2012  (JP) .................. 2012-252498

(51) Int. Cl.
| G06F 7/60 | (2006.01) |
|---|---|
| G06F 17/10 | (2006.01) |
| G06F 17/50 | (2006.01) |

(52) U.S. Cl.
CPC .................. G06F 17/5018 (2013.01)

(58) Field of Classification Search
CPC ........................ G06F 17/50; G06F 17/5018
USPC ............................................ 703/2
See application file for complete search history.

(56) References Cited

U.S. PATENT DOCUMENTS

| 6,161,057 | A * | 12/2000 | Nakano | B29C 45/7693 |
|---|---|---|---|---|
| | | | | 700/197 |
| 7,479,963 | B2 * | 1/2009 | Lischinski | G06T 13/60 |
| | | | | 345/473 |
| 7,765,091 | B2 * | 7/2010 | Lee | E21B 49/00 |
| | | | | 703/10 |
| 2011/0242095 | A1 | 10/2011 | Tsunoda | |
| 2013/0345994 | A1 * | 12/2013 | Wiklund | G01F 1/34 |
| | | | | 702/46 |

OTHER PUBLICATIONS

Pan et al., "A Ghost Cell Method for the Computation of Incompressible Flows with Immersed Bodies", International Conference on Fluid Mechanics and Aerodynamics (FMA'08), Rhodes, Greece, Aug. 20-22, 2008. pp. 78-83.

* cited by examiner

*Primary Examiner* — Aniss Chad
(74) *Attorney, Agent, or Firm* — Birch, Stewart, Kolasch & Birch, LLP

(57) ABSTRACT

A computer-implemented method for simulating a flow of fluid around a solid object comprises: defining straight lines between gravity points of elements in a solid object region and gravity points of elements in a fluid region; defining intersecting points of the straight lines with a boundary surface between the two regions; calculating distances between the intersecting points and the gravity points in the fluid region; and obtaining the shearing stress at the boundary surface.

6 Claims, 12 Drawing Sheets

COMPUTER-IMPLEMENTED METHOD FOR SIMULATING FLOW OF FLUID AROUND SOLID OBJECT

BACKGROUND OF THE INVENTION

The present invention relates to a computer-implemented method for simulating a flow of fluid around a solid object which can be used to accurately and quickly estimate the shearing stress between the fluid and the solid object at their boundary.

In recent years, computational fluid dynamics simulations are utilized in various fields in order to analyze various flow types, for example, a flow of air around a golf ball, a flow of unvulcanized rubber in an extruder, a flow of composite materials in a mixing device and the like in order to develop the dimples of the golf ball capable of improving flying characteristics of the golf ball, an extruder having a reduced resistance to extrusion, a mixing device capable of improving properties of the mixture, for example.

In a computational fluid simulation, as shown in FIG. 12, a model (b) of a space where fluid flows is defined by finite elements (c). On the finite elements (c), respective gravity points (d) for used in the fluid calculation are defined. In the space model (b), there is defined a boundary (e) between a solid object region b1 by which a model (a) of a solid object is defined and a fluid region b2 by which a model of the fluid are defined. Physical quantities of the fluid such as velocity, pressure and temperature are calculated at the gravity points (d). Based on such calculated physical quantities, the shearing stress of the fluid at the boundary (e) is estimated.

In such fluid simulation, as explained later, the process of calculating the shearing stress is complicated, and a very long computational time is required to obtain accurate simulation results.

SUMMARY OF THE INVENTION

It is therefore, an object of the present invention to provide a computer-implemented method for simulating a flow of fluid around a solid object, by which the shearing stress at the boundary between the fluid and the solid object can be accurately estimated in a short computational time.

According to the present invention, a computer-implemented method for simulating a flow of fluid around a solid object comprises:

a process in which a space model of a space is defined, wherein the space model is made up of elements have gravity points, a process in which a boundary surface is defined in the space model, wherein the boundary surface is between
a solid object region of the space model in which a solid object model is defined and
a fluid region of the space model which is outside the solid object region and in which a fluid model is defined, a process in which straight lines extending across the boundary surface are defined, wherein each of the straight lines extends between a pair of the adjacent gravity points which are one of the gravity points of the elements in the solid object region and one of the gravity points of the elements in the fluid region, a process in which an intersecting point of each of the straight lines with the boundary surface is defined, a process in which, for each of the straight lines, the distances between the gravity point in the fluid region and the intersecting point is calculated, a process in which the shearing stress between the fluid model and the solid object model at the boundary surface is obtained by using the following equation (1), $$\tau(\text{correct}) = \mu \frac{u(\text{live}) - u(\text{boundary})}{\text{dist}(\text{live cell to boundary})} A \quad \text{Equation (1)}$$

wherein
τ(correct) is the shearing stress between an element whose gravity point is in the solid object region and an element whose gravity point is in the fluid region,
u(live) is the velocity of the gravity point in the fluid region,
u(boundary) is the velocity of the intersecting point between the boundary surface and the straight line extending between the gravity point in the solid object region and the gravity point in the fluid region,
dist(live cell to boundary) is the distance between the gravity point in the fluid region and the intersecting point,
μ is the shear viscosity of the fluid, and
A is the area of a section of the boundary surface crossing at least one of the two elements whose gravity points are in the solid object region and the fluid region.

Therefore, in the method according to the present invention, since the shearing stress is calculated based on the straight lines, the complicated calculation as in the conventional method is not necessary. As a result, the shearing stress between the fluid model and the solid object model can be accurately calculated in short computational time.

It is preferable that, in the equation (1), dist'(live cell to boundary) modified from the dist(live cell to boundary) by using the following equation (2) is used instead of the dist(live cell to boundary), dist(live cell to boundary)=$L1 \times \alpha(\text{new})$ $\alpha(\text{new}) = -0.54\alpha^3 + 0.9825\alpha^2 + 0.4661\alpha + 0.08$ Equation (2)

wherein
L1 is the length of the straight line, and
α is the ratio of dist(live cell to boundary) to the length L1.
Preferably, the a(new) in the equation (2) is in a range of from 1 to 20, and when α=0, the α(new) is in a range of from 8 to 20.

Preferably, the Neumann boundary condition is defined as the pressure boundary condition for the boundary surface.

DESCRIPTION OF THE PREFERRED EMBODIMENTS

Embodiments of the present invention will now be described in detail in conjunction with the accompanying drawings.

The method for simulating a flow of fluid around a solid object according to the present invention (hereinafter the "fluid simulation method") is carried out by the use of a computer system 1.

The fluid simulation method according to an embodiment of the present invention is used to analyze the flow of the fluid around the solid object.

Figure 1:
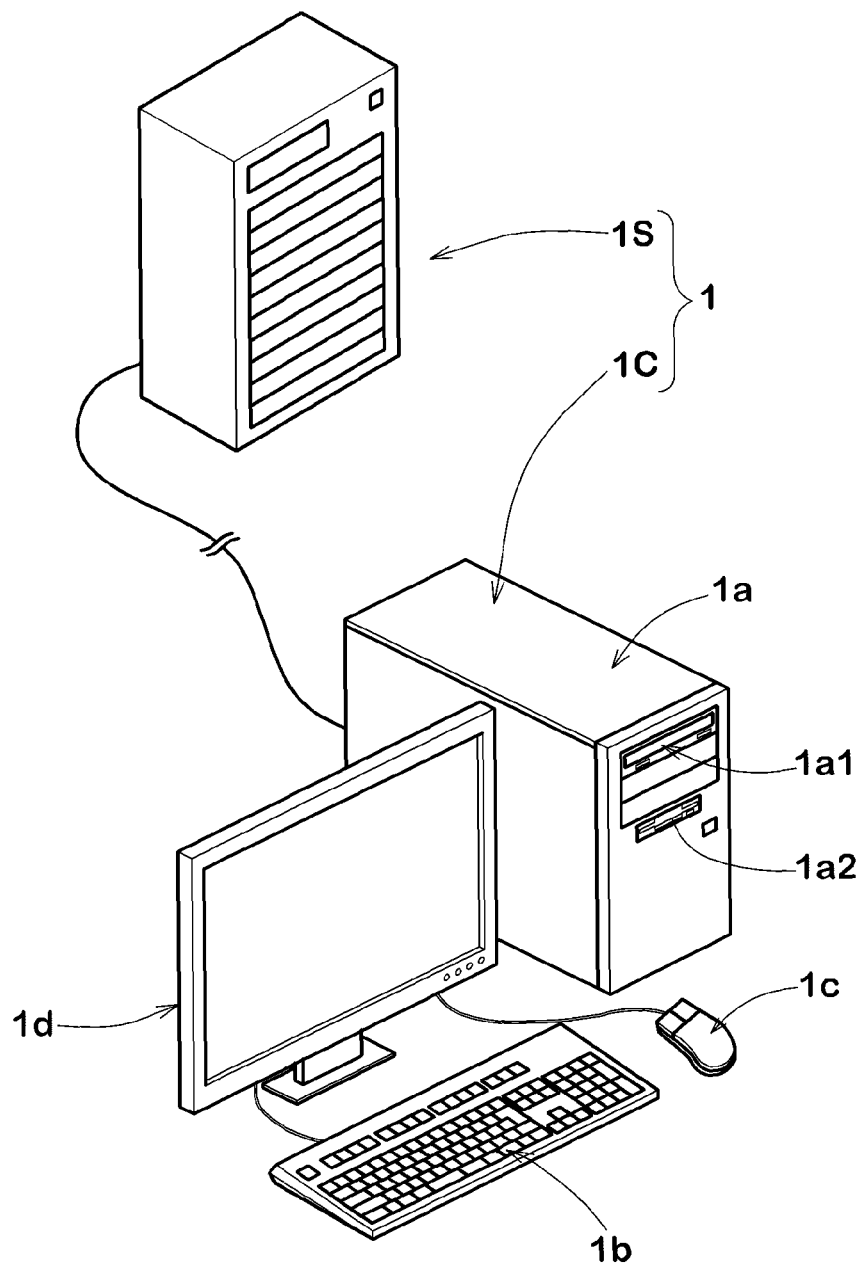
FIG. 1 shows a computer implementing the simulating method according to the present invention.

In this embodiment, as shown in FIG. 1, the computer system 1 comprises a compute server 1s in which large-scale computations are possible, and a client computer 1c connected to the compute server s and making the compute server 1s to carry out predefined calculations.

The client computer 1c comprises CPU, ROM, work memory and mass-storage device such as magnetic disk, a keyboard 1b, a mouse 1c, a display 1d and the like. Further, the client computer 1c is provided with disk drive devices 1a1 and 1a2 for an optical disk such as CD-ROM and a flexible disk.

In the above-mentioned mass-storage device, programs to perform the method according to the present invention are stored.

Figure 2:
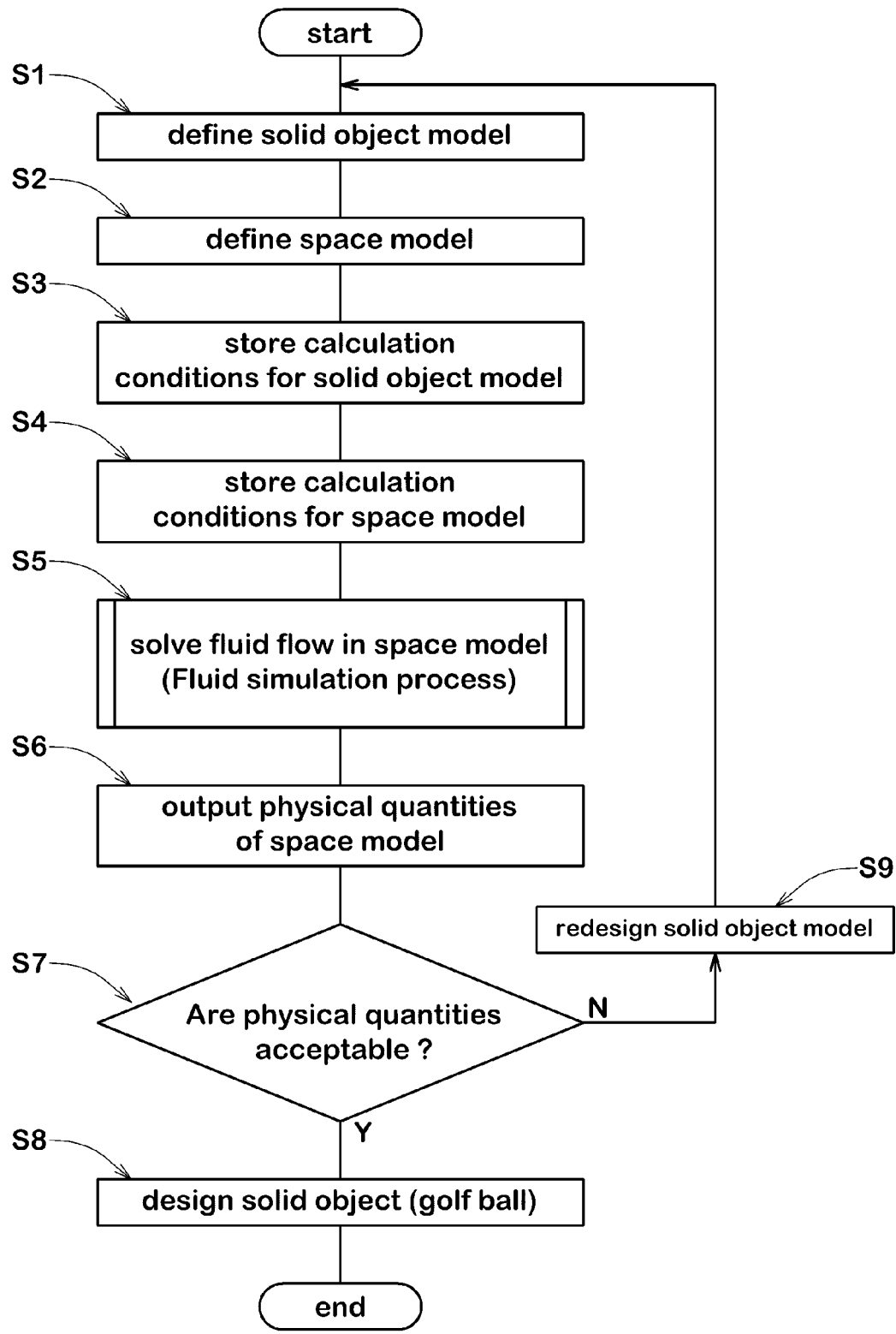
FIG. 2 is a flow chart of the simulating method as an embodiment of the present invention.

FIG. 2 shows a flow chart of the fluid simulation method as an embodiment of the present invention. The entire process thereof will be explained hereunder.

Process S1

In the process S1, a solid object model 2 which is a finite element model of the solid object is defined.

Figure 3:
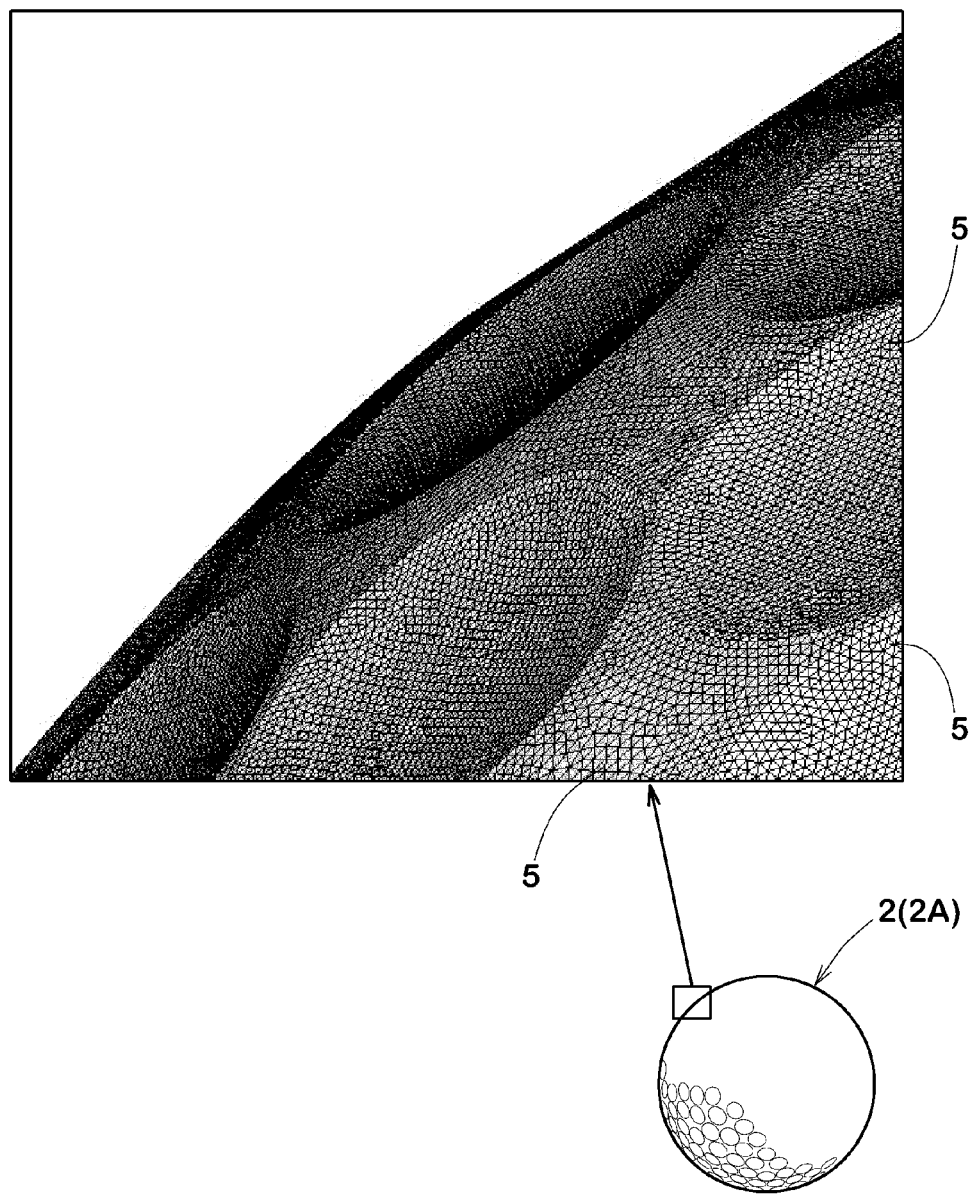
FIG. 3 shows a golf ball as an example of the solid object and a part of a solid object model of the golf ball.

In this example, as shown in FIG. 3, the solid object is a golf ball provided with dimples, therefore, the solid object model 2 is a golf ball model 2A.

The solid object is discretized, and the solid object model 2 is made up of a finite number of elements 5 in order to enable numerical analyses.

In this embodiment, the Lagrangian element whose displacement is unknown is used as the element 5 of the solid object model 2.

As to the numerical analysis method, for example, a finite element method is employed.

For each of the elements 5, numerical data—for example, an element number, node point numbers, coordinates of the node points in the X-Y-Z coordinate systems, and material characteristics (for example density, Young's modulus and/or damping coefficient and the like)—are defined and stored in the computer 1.

Process S2

In the process S2, a space model 3 of a space where the fluid (in this example, air) can flow and the solid object is disposed, is defined.

The space is discretized, and the space model 3 is made up of a finite number of elements 6 in order to enable numerical analyses.

Figure 4:
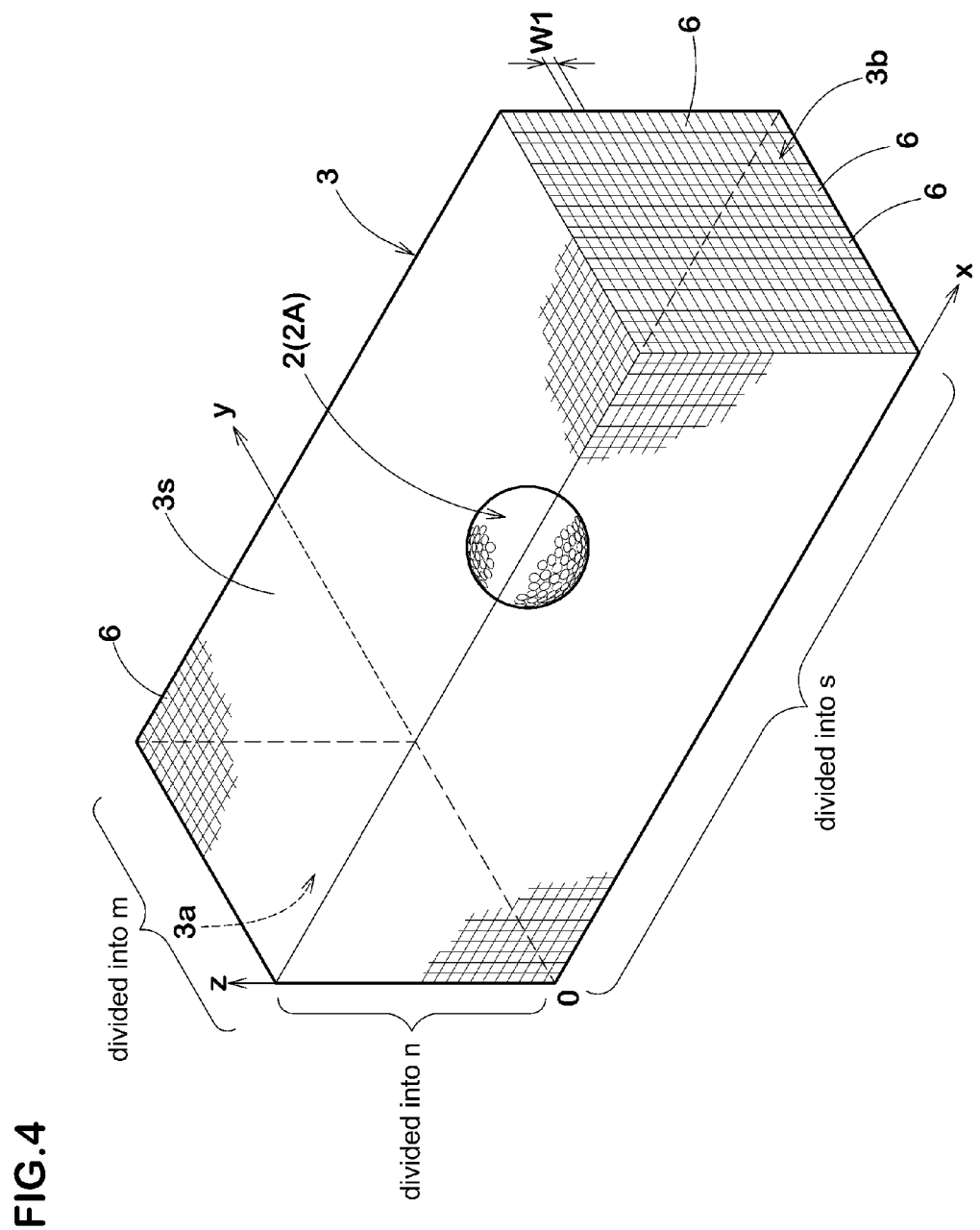
FIG. 4 is a perspective view of a space model with the solid object model disposed therein.

In this embodiment, as shown in FIG. 4, the space model 3 is formed as a rectangular parallelepiped having a size such that the entirety of the solid object model 2 is encompassed therein.

The space model 3 has a front surface 3a at one end in the x-axis direction, a rear surface 3b at the other end in the x-axis direction and side surfaces 3s extending between the front surface 3a and the rear surface 3b.

The elements 6 of the space model 3 are divided into s parts in the x-axis direction, m parts in the y-axis direction and n parts in the z-axis direction, wherein s, m and n are positive integers. The positive integer s, m and n are determined according to the size of the space model 3, the required accuracy of analysis, the fluid velocity and the like. Thus, the space model 3 in this embodiment is formed as an orthogonal grid.

In the case that the solid object is a golf ball having an outer diameter of 42.7 mm, it is preferable that the distance W1 between the grid points in the x-axis direction, the distance W1 between the grid points in the y-axis direction and the distance W1 between the grid points in the z-axis direction are set in a range of from 0.025 mm to 1.0 mm.

Figure 5:
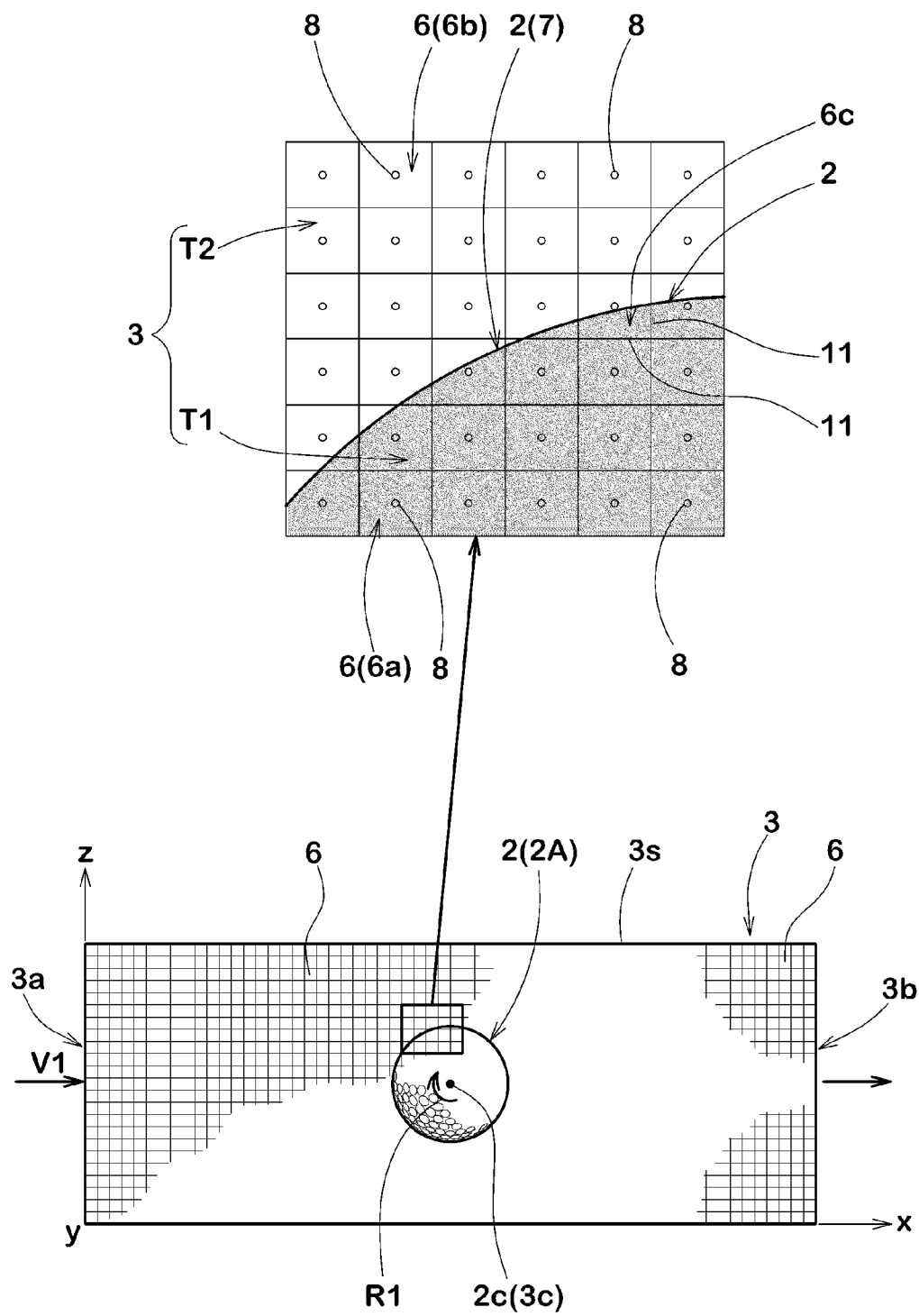
FIG. 5 is a side view of the space model.

As to the elements 6 of the space model 3, as shown in FIG. 5, Euler elements having gravity points 8 for fluid analysis are used.

For each of the elements 6, initial parameters of the fluid (air)—for example, specific gravity, viscosity, pressure and temperature—are defined.

The velocity, pressure and temperature of the fluid are calculated at the gravity points 8 in the fluid simulation.

Thus, in this application, the element 6 whose gravity point 8 is located in the fluid region b2 may be referred as the element 6 in the fluid region b2, and
the element 6 whose gravity point 8 is located in the solid object region b1 may be referred as the element 6 in the solid object region b1.

Process S3

In the process S3, conditions for calculating the solid object model 2 are stored in the computer 1.

Such conditions include the location data about the solid object model 2 relative to the space model 3 and the angular velocity R1 defining the rotation of the solid object model 2. In connection with the location data of the solid object model 2, it is preferable that the center 2c of the solid object model 2 coincides with the center 3c of the space model 3. Namely, such condition that the solid object model 2 is disposed in the center of the space model 3 is defined.

Process S4

In the process S4, conditions for calculating the space model 3 are stored in the computer 1.

Such conditions include boundary conditions for the space model 3, convergence conditions for a velocity field calculation using a pressure correction equation, and the number of iterations of the calculation.

As the boundary conditions for the space model 3, for example, the following are defined:
an inflow and outflow of the elements 6 passing through the side surfaces 3s of the space model 3 are not allowed;
an inflow of the elements 6 passing through the front surface 3a of the space model 3 (namely, flow velocity V1) is defined; and
at the rear surface 3b of the space model 3, the elements 6 are defined such that all of the parameters (pressure, velocity and the like) do not diverge, and an outflow of the elements 6 passing through the rear surface 3b of the space model 3 is defined by convergence calculation so that the amount of the outflow becomes same as that of the inflow.

Fluid Simulation Process S5

In the process S5, the computer 1 simulates the flow of the fluid around the solid object.

Figure 6:
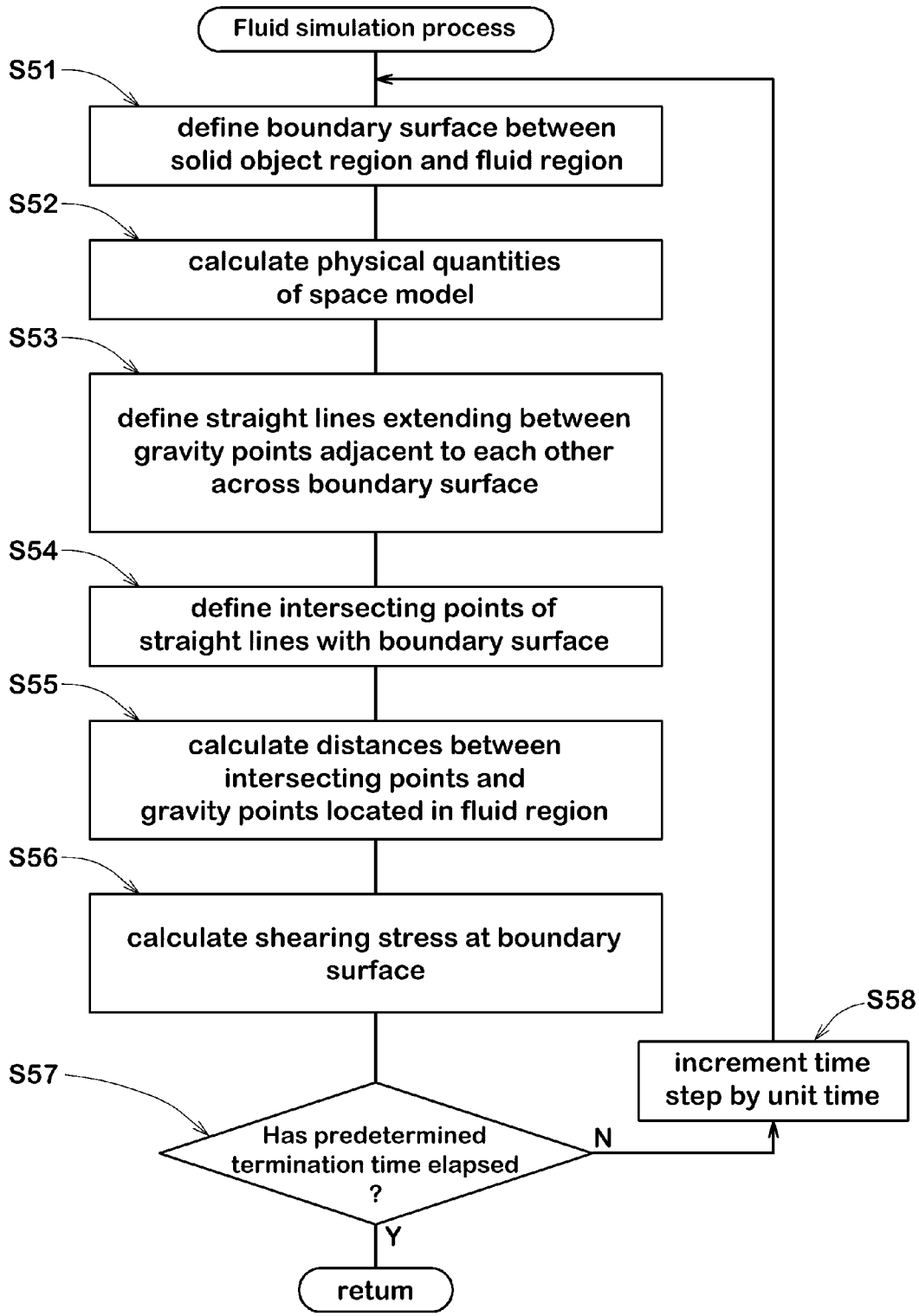
FIG. 6 is a flow chart of the fluid simulation process.

FIG. 6 shows a flow chart of such fluid simulation process S5.

Process S51

In the process S51, as shown in FIG. 5, a boundary surface 7 is defined in the space model 3 by the computer 1. The boundary surface 7 is that between a solid object region T1 in which the solid object model 2 is defined and a fluid region T2 which is outside the solid object region T1 and in which a fluid model is defined.

Thus, the boundary surface 7 is numeric data about the coordinate values specifying the surface of the solid object model 2 disposed in the space model 3. The coordinate values are those of the elements 5 defining the surface of the solid object model 2. Such coordinate values are stored in the computer 1.

Process S52

In the process S52, the physical quantities of the space model 3 are calculated for all of the elements 6 in the fluid region T2 excluding those in the solid object region T1.

In this embodiment, the motion in the space model 3 is expressed by the Navier-stokes equation based on the Immersed Boundary Method. The Navier-stokes equation is converted into an approximate expression and calculated by the computer 1. As a result, parameters representing the motional state of the air, i.e., the velocity and pressure at the gravity points 8 of the elements 6 of the space model 3 can be obtained.

In the element 6 changed from the solid object region T1 to the fluid region T2 by the increment in the time step of the simulation calculation, the pressure of an element 6 in the fluid region T2 adjacent to the element 6 concerned is defined as the initial value of the moving velocity of the solid object model 2, and the Navier-stokes equation is calculated.

The calculation of the motion state of the space model 3 can be made according to the "simulation method using a structured grid" described in Japanese Patent Application Publication No. 2012-83958. However, the calculation can be made by the use of commercially available application software for fluid analysis such as "FLUNET" of ANSYS, Inc.

In the case of the fluid simulations based on the Immersed Boundary Method,
on the premise that the pressure field is also present in the solid object region T1, the pressure correction equation is applied to all of the elements 6a of the solid object region T1. As a result, the pressure field of the solid object region T1 affects the pressure field of the fluid region T2, and the simulation accuracy tends to deteriorate.

Therefore, it is desirable that the Neumann boundary condition is defined on the boundary surface 7 so that the pressure gradient becomes zero in the solid object region T1.

In this embodiment, the Neumann condition is defined on the elements 6a in the solid object region T1.

In the element 6c crossed by the boundary surface 7, the Neumann condition is defined on the fluid region T2 side of the boundary surface 7.

The Neumann boundary condition provides a constraint condition to the differential values of the elements 6, 6 which are adjacent each other across the boundary surface 7.

As the constraint condition, for example, the difference between the differential values is set to zero.

Thereby, in this embodiment, it is possible to exclude the solid object region T1 from the calculation target. As a result, it is possible to calculate the fluid region T2 only as the calculation target.

In this embodiment, therefore, it is possible to prevent the pressure field of the fluid region T2 from being affected by the pressure field of the solid object region T1, and the simulation accuracy can be increased.

Incidentally, various methods for calculating the shearing stress of the space model 3 at the boundary surface 7 has been proposed.

For example, the following equation (3) is used in the nonpatent literature "A Ghost cell method for the computation of Incompressible Flows with Immersed Bodies", DARTZI PAN and TZUNG-TZA SHEN, 6th IASME/WSEAS International conference on FLUID MECHANICS and AERODYNAMICS (FMA'08)Rhodes, Greece, Aug. 20-22, 2008.

$$\tau = \mu \left( \frac{dv}{dn} \right) A \qquad \text{Equation (3)}$$

wherein
τ is the shearing stress,
μ is the shear viscosity of the fluid,
A is the area of the boundary surface,
v is the velocity of the fluid, and
n is a normal vector.
when the solid object model 2 and the space model 3 are three-dimensional, the shearing stress τ in each of the x-axis, y-axis and z-axis directions is calculated.

To use this equation (3), it is necessary to obtain the velocity gradient (dv/dn) of the space model 3 along the normal vector to the boundary surface 7 based on that the velocity at the boundary surface 7 is zero.

Figure 7A:
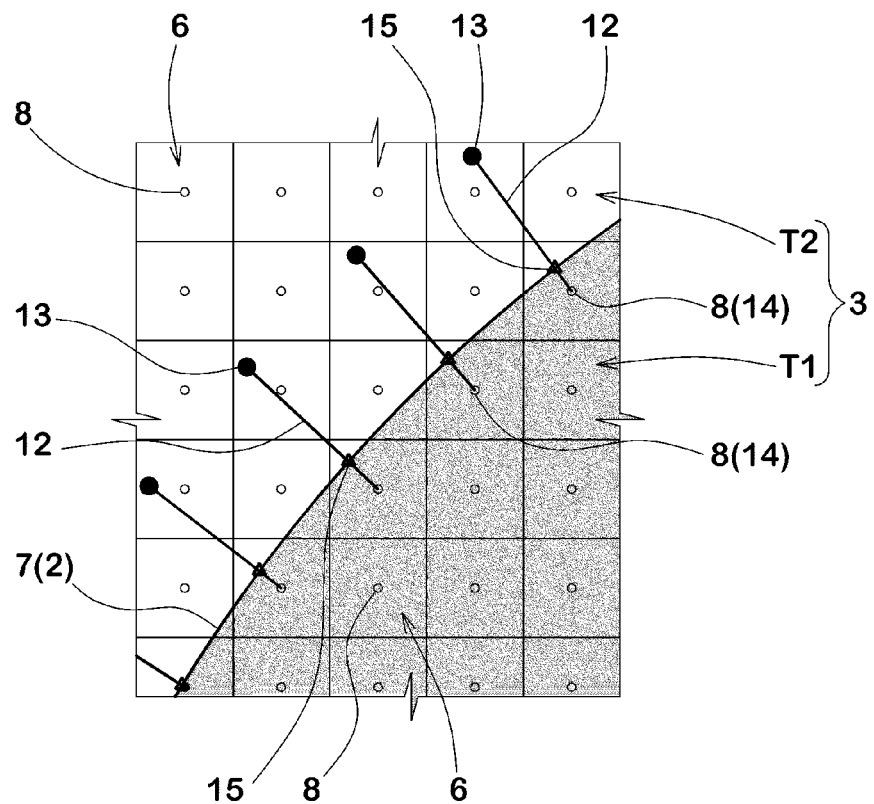
FIGS. 7(a) and 7(b) are diagrams for explaining the conventional calculation method for a shearing stress.

In order to obtain the velocity gradient (dv/dn), as shown in FIG. 7(a), a normal line 12 to the boundary surface 7 is determined. The normal line 12 extends between the elements 6 and 6 adjacent to the boundary surface 7.

One end of the normal line 12 is positioned at a fluid side point 13 defined in one of the elements 6 in the fluid region T2. The other end of the normal lines 12 is positioned at a solid object side point 14 defined at the gravity point 8 of one of the elements 6 in the solid object region T1.

The intersecting point 15 of the normal line 12 with the boundary surface 7 is determined.

Figure 7B:
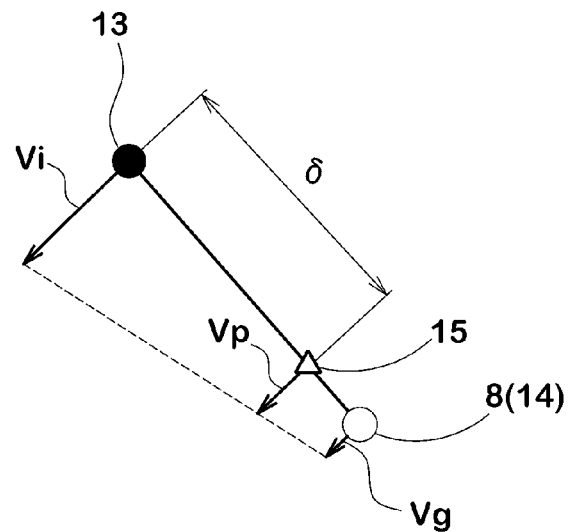

Then, as shown in FIG. 7(b), the velocity gradient from the intersecting point 15 to the fluid side points 13 is calculated by using the following equation (4).

$$\frac{\partial v}{\partial n} = \frac{v_i - v_p}{\delta} \qquad \text{Equation (4)}$$

wherein
$v_i$ is the velocity of the fluid at the fluid side point,
$v_p$ is the velocity of the fluid at the intersecting point, and
δ is the distance between the fluid side point and the intersecting point.

The fluid side point 13 and the intersecting point 15 are not defined at the gravity points 8 of the elements 6 in the fluid region T2, therefore, the velocity $v_i$ of the fluid side point 13 and the velocity $v_p$ of the intersecting point 15 have to be estimated from the velocities calculated at a plurality of gravity points 8 of the elements 6 which are adjacent to the fluid side point 13 and the intersecting point 15.

Next, the velocity $v_g$ of the solid object side point 14 is calculated by the following equation (5).

$$v_g = v_p - \frac{\partial v}{\partial n}|r_g - r_p| \qquad \text{Equation (5)}$$

wherein
$v_g$ is the velocity of the fluid at the solid object side point,
$v_p$ is the velocity of the fluid at the intersecting point,
$r_g$ is the position vector of the solid object side point, and
$r_p$ is the position vector of the intersecting point.

In the equation (5), the velocity $v_g$ is calculated by the use of the velocity gradient calculated by the use of the equation (4) from the difference $(r_g - r_p)$ between the position vector r of the solid object side point 14 and the position vector $r_p$ of the intersecting point 15.

The velocity gradient (dv/dn), which is based on that the velocity is zero at the boundary surface 7, is obtained by adjusting the velocity $V_g$ such that the velocity $v_p$ becomes zero.

Thus, in this conventional method, it is necessary to estimate the velocity $v_i$ and the velocity $v_p$ from the velocities at a plurality of gravity points 8 of the elements 6. In addition, it is necessary to make the velocity $v_p$ zero by changing the velocity $v_g$.

Therefore, in this conventional method, the calculation process is complicated, and a very long computational time is required to obtain accurate simulation results.

Process S53

Figure 8B:
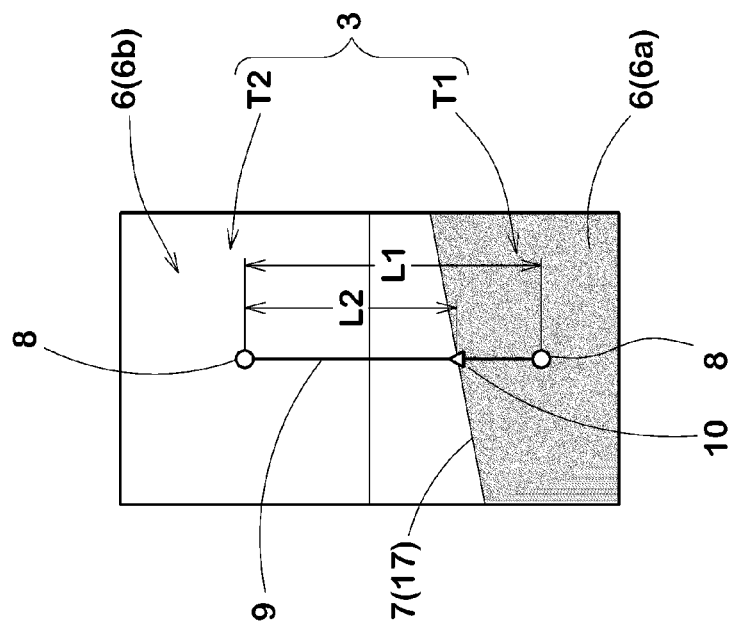
FIGS. 8(a) and 8(b) are diagrams for explaining the calculation method for a shearing stress according to the embodiment of the present invention.
Figure 8A:
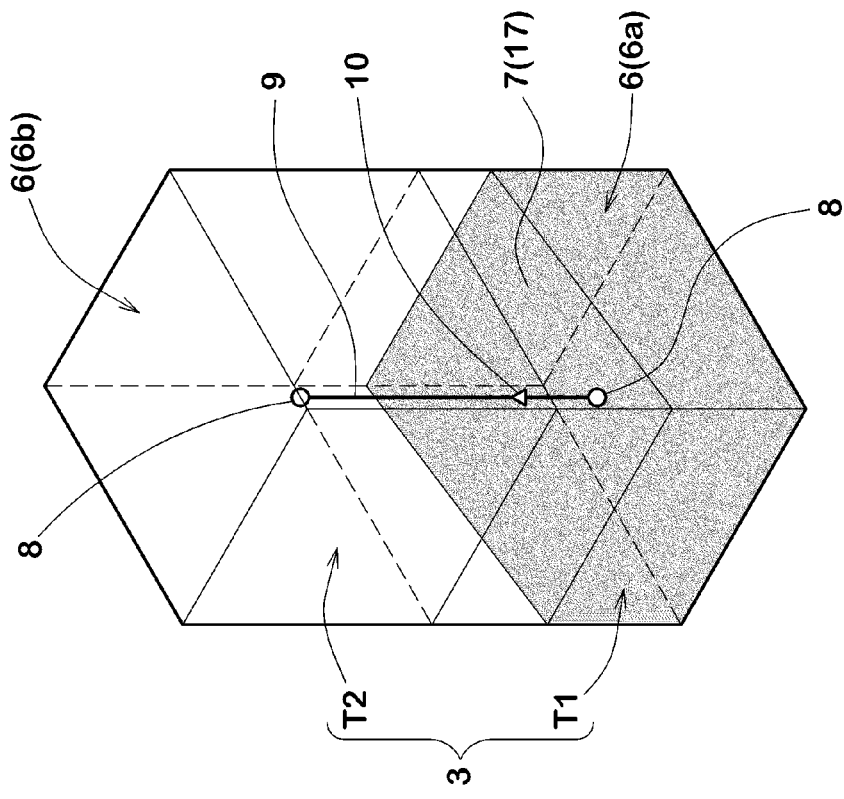

In this invention, prior to the calculation of the shearing stress in the space model 3, straight lines 9 extending across the boundary surface 7 are defined so that, as shown in FIG. 8(*a*), each of the straight lines 9 connects between one of the gravity points 8 of the elements 6*a* in the solid object region T1 and
one of the gravity points 8 of the elements 6*b* in the fluid region T2,
which are adjacent to each other across the boundary surface 7.

More specifically, in this process S53, from the gravity points 8 of the elements 6*a* in the solid object region T1 and also from the gravity points 8 of the elements 6*b* in the fluid region T2, plural pairs of the most adjacent gravity points 8 which are mostly adjacent to each other across the boundary surface 7 are searched.

Then, the straight lines 9 each extending between the paired most adjacent gravity points 8 across the boundary surface 7, are defined.

In actuality, the straight line 9 is numeric data specifying the coordinates of the paired most adjacent gravity points 8, which data are stored in the computer 1.

The method for searching the most adjacent gravity points 8 is not limited to a particular method. For example, "Method for searching the nearest neighbor value of search points from group of real number" disclosed in Japanese patent application publication No. 2011-108113 can be suitably adopted. By adopting this method, it is possible to efficiently search the most adjacent gravity points 8 and 8 of the elements 6*a* and 6*b*.

Process S54

In the next process S54, the intersecting points 10 of the straight lines 9 with the boundary surface 7 are defined by the computer 1. In actuality, the intersecting points 10 are their coordinate values specified in the space model 3 and stored in the computer 1.

Process S55

In the process S55, as shown in FIG. 8(*b*), for each pair of the most adjacent gravity points 8, the distance L2 between the gravity point 8 of the elements 6*b* in the fluid region T2 and the intersecting point 10 is calculated by the computer 1. The distance L2 is stored in the computer 1.

Process S56

In the process S56, the shearing stress τ(correct) in the space model 3 at the boundary surface 7 is calculated by using the following equation (1).
when the solid object model 2 and the space model 3 are three-dimensional as in this embodiment, the shearing stress τ(correct) is calculated with respect to each of the x-axis, y-axis and z-axis directions.

$$\tau(\text{correct}) = \mu \frac{u(\text{live}) - u(\text{boundary})}{\text{dist(live cell to boundary)}} A \qquad \text{Equation (1)}$$

wherein
τ(correct) is the shearing stress between an element whose gravity point is in the solid object region and an element whose gravity point is in the fluid region,
u(live) is the velocity of the gravity point in the fluid region,
u(boundary) is the velocity of the intersecting point between the boundary surface and the straight line extending between the gravity point in the solid object region and the gravity point in the fluid region,
dist(live cell to boundary) is the distance between the gravity point in the fluid region and the intersecting point,
μ is the shear viscosity of the fluid, and
A is the area of a section of the boundary surface crossing at least one of the two elements whose gravity points are in the solid object region and the fluid region.

The velocity u(live) of the gravity point 8 in the fluid region T2 is determined based on the result of the calculation of the physical quantities of the space model 3 performed in the aforementioned Process S52.

The velocity u(boundary) of the intersecting point 10 is determined based on the velocity estimated from at least one gravity point 8 of the element 6*b* in the fluid region T2 which point or points are adjacent to the intersecting point 10 concerned.

The dist(live cell to boundary) is the distances L2 between the gravity point 8 and the intersecting point 10 calculated in the aforementioned Process S55.

As to the shear viscosity μ, the predetermined value of the shear viscosity of the fluid is set. In this embodiment, the fluid is air, therefore, the shear viscosity μ of air in a predetermined condition is set.

The area A is, as shown in FIG. 8(*a*), the area of a section 17 of the boundary surface 7 which section is crossed by the element 6.

Thus, in the process S56, the shearing stress τ(correct) can be obtained by using the straight line 9 extending between the most adjacent gravity points 8 across the boundary surface 7.

In the present invention, accordingly, it is not necessary to define the normal lines 12 to the boundary surface 7 and also the fluid side points 13 as in the conventional method shown in FIG. 7(*a*).

Further, it is not necessary to estimate the velocity $v_i$ of the fluid side point 13 from the velocity of the adjacent gravity point 8 of the space model 3, and also not necessary to change the velocity $v_g$ of the solid object side point 14 so that the velocity $v_p$ of the intersecting point 10 becomes zero as in the prior art.

In the present invention, therefore, the calculation is not complicated, and the shearing stress at the boundary surface 7 can be accurately estimated in short computational time.

If the dist(live cell to boundary) which is a denominator in the equation (1) is too small, the shearing stress τ(correct) becomes too large, and there is a possibility that the computation becomes unstable. In the worst case, there is a possibility that the division by zero occurs, and the calculated value diverges. Therefore, it is preferable that, instead of the dist(live cell to boundary), dist'(live cell to boundary) which is modified by using the following equation (2) is used in the equation (1).

dist(live cell to boundary)=$L1 \times \alpha$(new)

$$\alpha(\text{new}) = -0.54\alpha^3 + 0.9825\alpha^2 + 0.4661\alpha + 0.08 \qquad \text{Equation(2)}$$

wherein
L1 it the length of the straight line, and
α is the ratio of the dist(live cell to boundary) to L1.

(0=<α=<1)

Figure 9A:
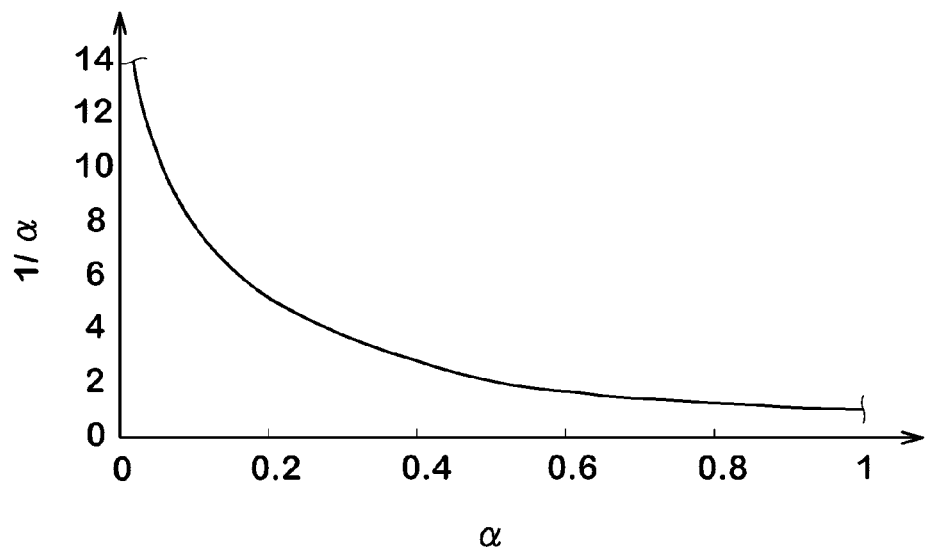
FIG. 9(a) is a graph showing the relationship between α and 1/α.
Figure 9B:
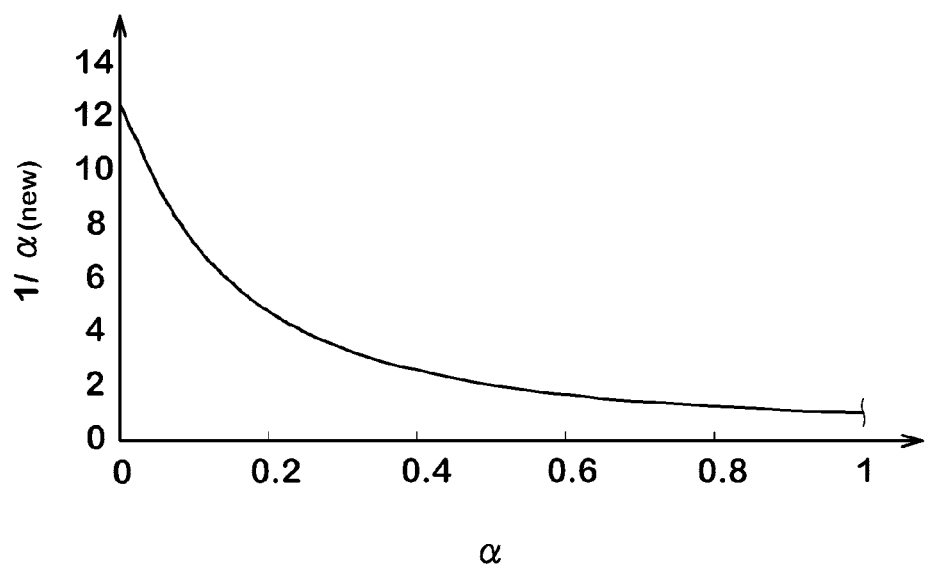
FIG. 9(b) is a graph showing the relationship between α and 1/α(new).

As shown in FIG. 9(*a*), if α converges to zero, 1/α diverges to infinity. This indicates that, in the aforementioned equation (1), if the dist(live cell to boundary) become very small, the shear stress τ(correct) becomes excessively large.

As shown in FIG. 9(*b*), if α(new) modified from a by the equation (2) converges to zero, 1/α(new) converges to about 12. Accordingly, even if the dist(live cell to boundary) becomes very small, the shearing stress τ(correct) is prevented from becoming excessively large.

Therefore, by using the modified dist'(live cell to boundary) instead of the dist(live cell to boundary), it is possible to increase the computational stability.

In order to effectively derive the above functions, it is preferred that the value of α(new) is more than 1, but not more than 20. If more than 20, the shearing stress τ(correct) becomes too large, and there is a possibility that the calculation becomes unstable. If less than 1, the shearing stress τ(correct) becomes too small, and there is a possibility that the calculation accuracy is reduced.

When α=0, it is preferable that the value of α(new) is not less than 8, but not more than 20.

Figure 10:
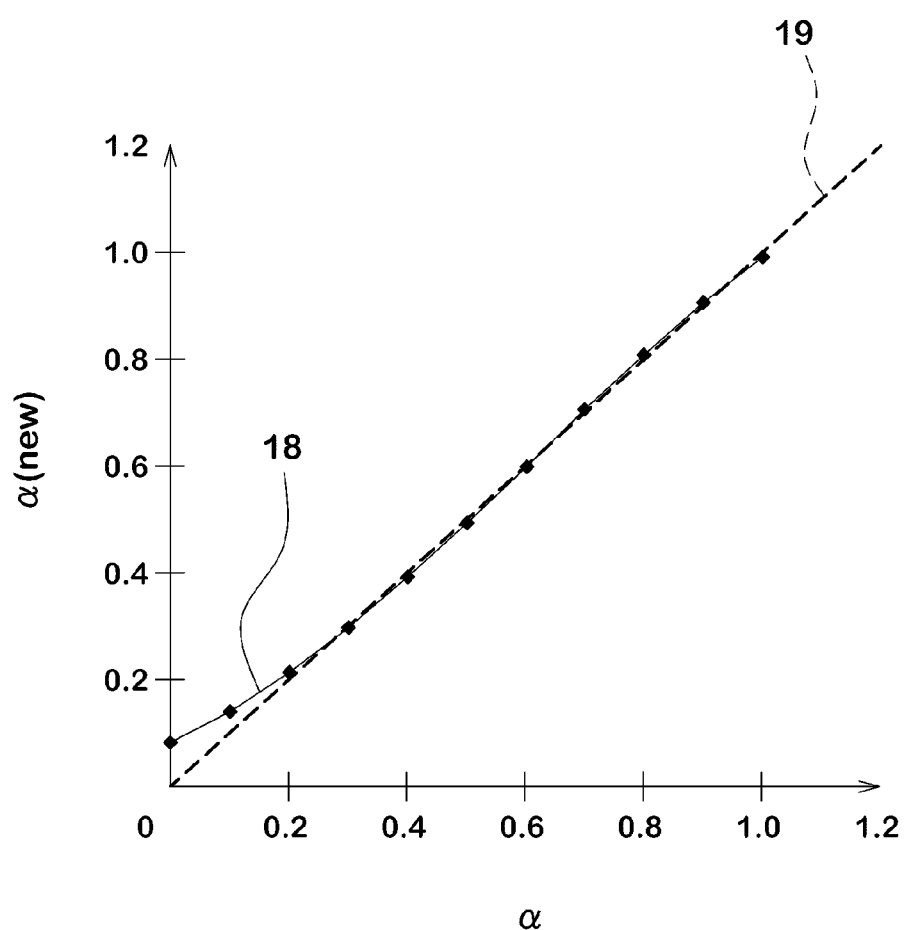
FIG. 10 is a graph showing the relationship between α and α(new).

The value of the α(new) can be arbitrarily selected from the above-mentioned range, but it is preferable that the relationship between the α(new) and α is of a monotonically increasing continuous function 18 where α(new) increases with the increase of a as shown in FIG. 10.

More preferably, the continuous function 18 approximates to the straight line 19 corresponding to a linear function α(new)=α in order to minimize the error between α(new) and α, and thereby to maintain the calculation accuracy.

Process S57

In the process S57, the computer 1 judges whether the predetermined termination time for the simulation calculation has elapsed or not.

If elapsed, the computer 1 ends the fluid simulation Process S5, and the entire process goes to Process S6.

If not elapsed, the entire process goes to Process S58.

Process S58

In the process S58, the computer 1 increments the time step of the simulation calculation by a unit time Tx. Then, the above described processes S51-S56 are repeated.

Thus, in the fluid simulation, the physical quantities of the space model 3 are obtained in every unit time Tx.

Process S6

In the process S6, the computer 1 outputs the physical quantities of the space model 3.

Process S7

In the process S7, the computer 1 judges whether the physical quantities of the space model 3 are acceptable or not.

If acceptable, the solid object (golf ball) is actually designed based on the specifications of the solid object model 2 (golf ball model 2A). — Process S8

If not acceptable, the solid object model is redesigned. — Process S9 Then, the fluid simulation (Processes S1-S7) is performed again.

In the fluid simulation method in this embodiment, the solid object model 2 is redesigned until the physical quantities of the space model 3 become acceptable, therefore, the solid object (the golf ball) with excellent performance can be developed efficiently.

Comparison Tests

According to the procedure shown in FIG. 2, the solid object model (golf ball model) shown in FIG. 3 and the space model shown in FIG. 4 were generated by the computer 1.

EXAMPLE

Then, according to the procedure shown in FIG. 6, the fluid simulation was performed, and the shearing stress in the space model at the boundary surface was calculated.

Figure 11A:
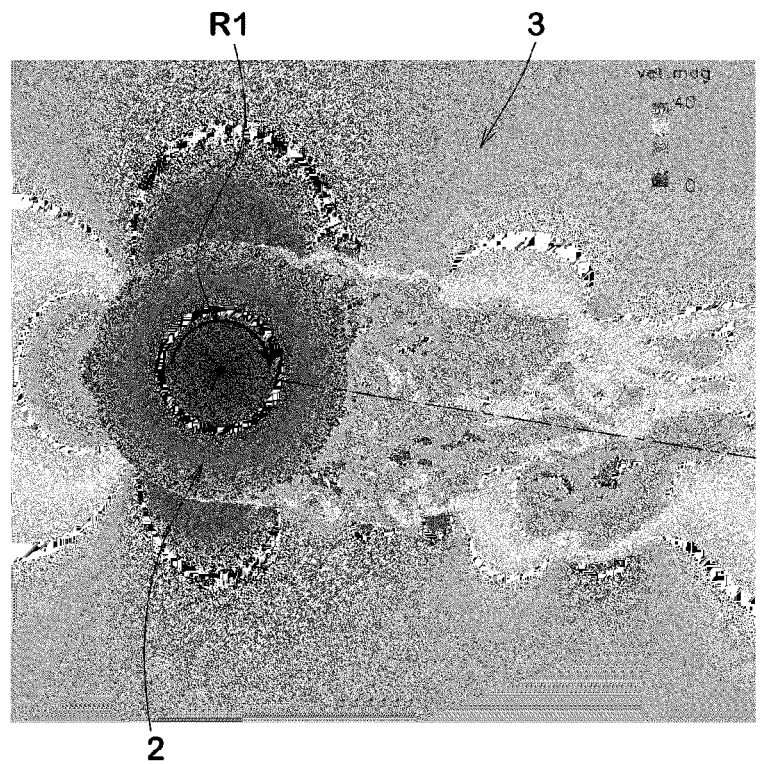
FIG. 11(a) shows a result of the fluid simulation according to the present invention.
Figure 11B:
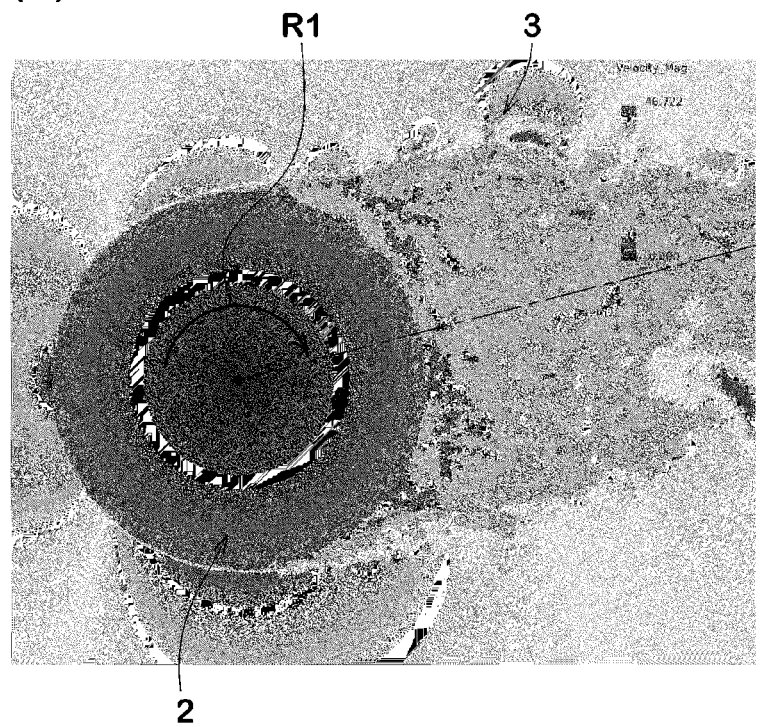
FIG. 11(b) shows a result of the fluid simulation according to the conventional method.
Figure 12:
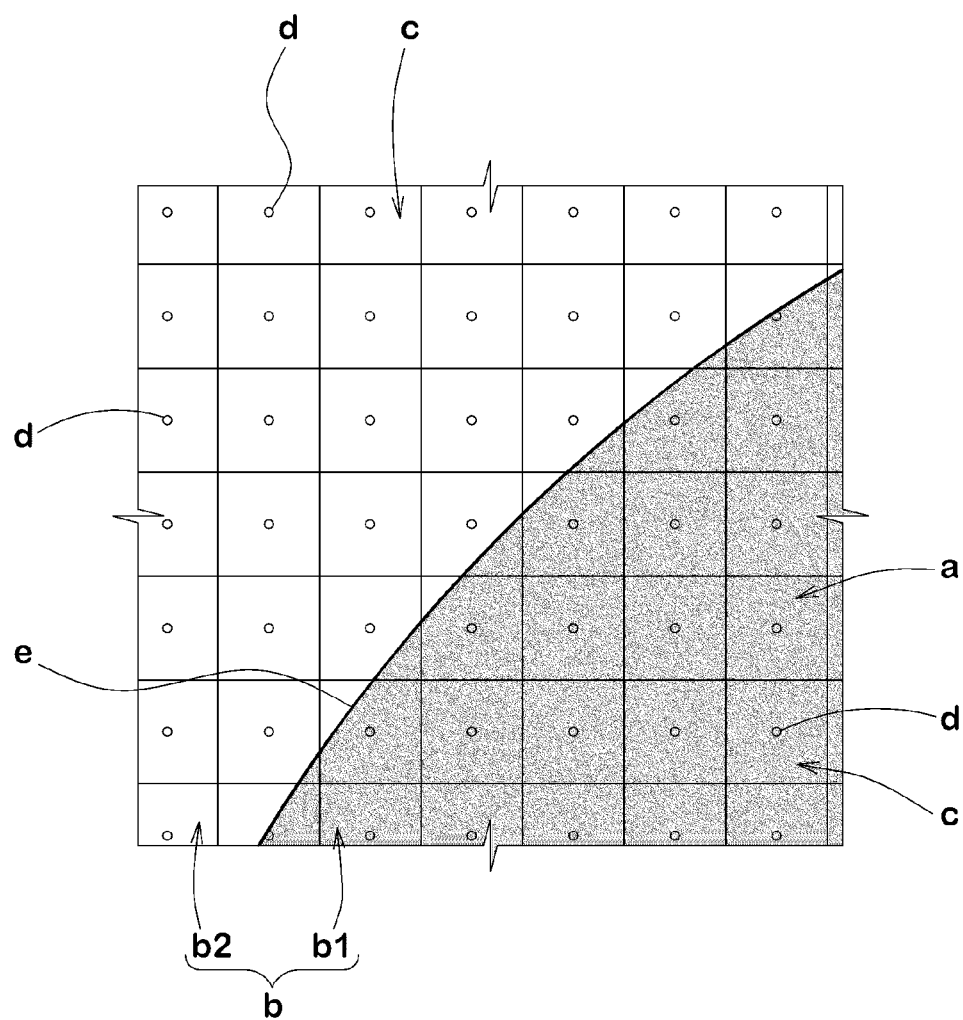
FIG. 12 is a diagram for explaining the conventional calculation method for a shearing stress.

FIG. 11(*a*) shows a result of the fluid simulation.

COMPARATIVE EXAMPLE

Based on the conventional method (ghost cell method) using the above equations (3), (4) and (5), a fluid simulation was performed, and the shearing stress was calculated.

FIG. 11(*b*) shows a result of the fluid simulation.

The motion calculation of the space model was made based on "simulation method using a structured grid" disclosed in Japanese patent application publication No. 2012-83958.

Conditions and parameters common to both of the example and comparative example are as follows:
Computer: workstation XE340 of SGI, Inc.
Number of cores of CPU: 160 cores
Memory: 1.44 TB (72 GB/node)
Processing method: Parallel processing with MPI
solid object model (golf ball model):
  Outer diameter: 42.7 mm
  Angular velocity R1: 2500 rpm
Space Model:
  Distance W1 between grid points: 0.08 mm (in the vicinity of the golf ball model)
  flow velocity V1: 58 meter/second Test Results The computational time of the example according to the present invention was reduced to about 80% of the computational time of the comparative example. Therefore, the fluid simulation method according to the present invention can calculate the shearing stress in a short time in comparison with the conventional method.

Further, it was confirmed that the lift force acting on the golf ball having backspin could be accurately simulated in the example according to the present invention as shown FIG. 11(*a*) although the lift force could not be accurately simulated in the comparative example as shown FIG. 11(*b*) (the direction of the lift force was reversed).

Therefore, in the fluid simulation method according to the present invention, it is possible to accurately estimate the shearing stress when compared with the conventional method.

The invention claimed is:

1. A computer-implemented method for simulating a flow of fluid around a solid object comprising the steps of:
  defining a space model of a space is defined, wherein the space model is made up of elements have gravity points;
  defining a boundary surface in the space model, wherein the boundary surface is between a solid object region of the space model in which a solid object model is defined and a fluid region of the space model which is outside the solid object region and in which a fluid model is defined;
  defining straight lines extending across the boundary surface, wherein each of the straight lines extends between a pair of the adjacent gravity points which are one of the gravity points of the elements in the solid object region and one of the gravity points of the elements in the fluid region;
  defining an intersecting point of each of the straight lines with the boundary surface;
  calculating for each of the straight lines, the distances between the intersecting point and the gravity point in the fluid region;
  obtaining the shearing stress between the fluid model and the solid object model at the boundary surface by using the following equation (1)

$$\tau(\text{correct}) = \mu \frac{u(\text{live}) - u(\text{boundary})}{\text{dist}(\text{live cell to boundary})} A, \quad \text{Equation (1)}$$

wherein
  $\tau$(correct) is the shearing stress between an element whose gravity point is in the solid object region and an element whose gravity point is in the fluid region,
  U(live) is the velocity of the gravity point in the fluid region,
  U(boundary) is the velocity of the intersecting point between the boundary surface and the straight line extending between the gravity point in the solid object region and the gravity point in the fluid region,
  dist(live cell to boundary) is the distance between the gravity point in the fluid region and the intersecting point,
  $\mu$ is the shear viscosity of the fluid, and
  A is the area of a section of the boundary surface crossing at least one of the two elements whose gravity points are in the solid object region and the fluid region;
  judging if physical quantities of the space model are acceptable;
  changing the design of the solid object model in order to reexecute the aforementioned steps when the physical quantities are not acceptable; and
  outputting data about the space model in order to actually design the solid object based on data about the solid object model when the physical quantities are acceptable.

2. The fluid simulation method according to claim 1, wherein,
  in the equation (1), instead of the dist(live cell to boundary), dist'(live cell to boundary) modified by using the following equation (2) is used:

$$\text{dist}'(\text{live cell to boundary}) = L1 \times \alpha(\text{new})$$

$$\alpha(\text{new}) = -0.54\alpha^3 + 0.9825\alpha^2 + 0.4661\alpha + 0.08 \quad \text{Equation(2)}$$

wherein
  L1 is the length of the straight line, and
  $\alpha$ is the ratio of dist(live cell to boundary) to the length L1.

3. The fluid simulation method according to claim 2, wherein
  the $\alpha$(new) in the equation (2) is in a range of from 1 to 20, and
  when $\alpha=0$, the $\alpha$(new) is in a range of from 8 to 20.

4. The fluid simulation method according to claim 3, wherein
  the Neumann boundary condition is defined as the pressure boundary condition for the boundary surface.

5. The fluid simulation method according to claim 2, wherein
  the Neumann boundary condition is defined as the pressure boundary condition for the boundary surface.

6. The fluid simulation method according to claim 1, wherein
  the Neumann boundary condition is defined as the pressure boundary condition for the boundary surface.

* * * * *